(12) United States Patent
Fukazawa et al.

(10) Patent No.: US 8,003,174 B2
(45) Date of Patent: Aug. 23, 2011

(54) METHOD FOR FORMING DIELECTRIC FILM USING SILOXANE-SILAZANE MIXTURE

(75) Inventors: Atsuki Fukazawa, Tama (JP); Woo Jin Lee, Tama (JP); Nobuo Matsuki, Tama (JP)

(73) Assignee: ASM Japan K.K., Tokyo (JP)

( * ) Notice: Subject to any disclaimer, the term of this patent is extended or adjusted under 35 U.S.C. 154(b) by 921 days.

(21) Appl. No.: 11/955,766

(22) Filed: Dec. 13, 2007

(65) Prior Publication Data
US 2009/0156017 A1 Jun. 18, 2009

(51) Int. Cl.
*H05H 1/24* (2006.01)

(52) U.S. Cl. ..... 427/574; 427/578; 427/579; 427/376.2; 427/397.7

(58) Field of Classification Search .................. 427/574, 427/577, 578, 579, 376.2, 397.7
See application file for complete search history.

(56) References Cited

U.S. PATENT DOCUMENTS

| | | | | |
|---|---|---|---|---|
| 4,478,875 | A * | 10/1984 | Pachonik et al. | 427/489 |
| 6,068,884 | A * | 5/2000 | Rose et al. | 438/762 |
| 6,239,042 | B1 * | 5/2001 | Sonego et al. | 438/778 |
| 6,455,455 | B1 | 9/2002 | Deller et al. | |
| 6,740,602 | B1 | 5/2004 | Hendriks et al. | |
| 6,818,570 | B2 | 11/2004 | Tsuji et al. | |
| 7,108,771 | B2 * | 9/2006 | Xu et al. | 203/41 |
| 7,354,873 | B2 | 4/2008 | Fukazawa et al. | |
| 7,586,554 | B2 * | 9/2009 | Ryuzaki et al. | 349/43 |
| 7,651,959 | B2 * | 1/2010 | Fukazawa et al. | 438/786 |
| 7,781,352 | B2 * | 8/2010 | Fukazawa et al. | 438/792 |
| 2002/0028543 | A1 * | 3/2002 | Yamazaki et al. | 438/154 |
| 2003/0201465 | A1 * | 10/2003 | Ryuzaki et al. | 257/200 |
| 2004/0176488 | A1 * | 9/2004 | Mukherjee et al. | 521/61 |
| 2005/0095840 | A1 * | 5/2005 | Bhanap et al. | 438/623 |
| 2006/0063012 | A1 * | 3/2006 | Shin et al. | 428/447 |
| 2006/0165904 | A1 | 7/2006 | Ohara | |
| 2007/0289534 | A1 * | 12/2007 | Lubomirsky et al. | 118/723 R |
| 2009/0142935 | A1 * | 6/2009 | Fukazawa et al. | 438/792 |

OTHER PUBLICATIONS

Lucovsky, G., et al., "Deposition of Silicon-Based Dielectrics by Remote Plasma-Enhanced Chemical Vapor Deposition". Journal of Crystal Growth, 86 (1988), pp. 804-814.*

Rodriguez-Baeza, Mario, et al., "Obtention of Powdered Ceramic Materials by Pyrolysis of Poly[(Dimethylsiloxane)-CO-(Dimethlysilazane)] Copolymers as Precursors". Journal of the Chilean Chemical Society, v.51, n.2 Concepcion Jun. 2006, pp. 913-917.*

Choukourov, A., et al., "A comparison of polyatomic ion deposited, RF magnetron sputtered and plasma polymer organosilicon films". Thin Solid Films, 502 (2006), pp. 40-43.*

Choukourov, A., et al., "A comparison of polyatomic ion deposited, RF magnetron sputtered and plasma polymer organosilicon films". Thin Solid Films 502 (2006) pp. 40-43.*

* cited by examiner

*Primary Examiner* — Bret Chen
(74) *Attorney, Agent, or Firm* — Knobbe, Martens, Olson & Bear LLP

(57) ABSTRACT

A method of forming a dielectric film, includes: introducing a siloxane gas essentially constituted by Si, O, C, and H and a silazane gas essentially constituted by Si, N, H, and optionally C into a reaction chamber where a substrate is placed; depositing a siloxane-based film including Si—N bonds on the substrate by plasma reaction; and annealing the siloxane-based film on the substrate in an annealing chamber to remove Si—N bonds from the film.

14 Claims, 3 Drawing Sheets

METHOD FOR FORMING DIELECTRIC FILM USING SILOXANE-SILAZANE MIXTURE

BACKGROUND OF THE INVENTION

1. Field of the Invention

The present invention relates generally to a semiconductor technique and more particularly to a silicone-containing dielectric film having good mechanical strength.

2. Description of the Related Art

In the plasma chemical vapor deposition (plasma CVD) method, a film is formed on a semiconductor substrate by placing the semiconductor substrate, being the processing target, on a heater of resistance heating type, etc., that has been heated to a temperature of 0 to 350° C. in an atmosphere of 1 to 10 Torr. The heater is installed in a manner facing a shower plate that releases a reactant gas, and RF power of 13.56 to 60 MHz, etc., is applied to the shower plate at an output of 100 to 4,000 W to implement RF discharge between the heater and shower plate and thereby generate plasma. This plasma CVD method is used to form thin films such as interlayer insulation films, passivation films and anti-glare films.

Since causing an excessive surface diffusion is difficult in plasma CVD processes of parallel plate type, traditionally oxide films and other films having embedding characteristics have been used in high-density plasma CVD processes using microwaves. For copper wirings adopted for the purpose of improving RC delays, the damascene technology whereby grooves are formed in an insulation film to embed copper was adopted to address the difficulty associated with etching of copper materials. Adoption of damascene structures eliminated the need to require insulation films to provide embedding characteristics and height-gap covering performance, and at the same time low dielectric constant films were adopted for the purpose of lowering the dielectric constants of insulation films. Low dielectric constant films were adopted first by logic devices having a node of 90 nm, which are currently mass-produced using films with a dielectric constant of approx. 3.0 to 3.3.

Manufacturers are developing low dielectric constant films in response to the need for films having a dielectric constant of 2.5 or less at device nodes of 45 nm and less. However, lowering the dielectric constant promotes density reduction, resulting in the film sustaining significant damage in the etching, ashing and other steps in the damascene process. The various damages sustained in these steps cause the dielectric constant of the low dielectric constant film to increase by approx. 0.1 to 0.5, which reduces the benefit of using the low dielectric constant film in the first place. In view of the above, sometimes a step to restore the dielectric constant using the restore technology is combined to restore the damaged film. At device nodes of 32 nm and less, however, low dielectric films having even a lower dielectric constant are needed, where the required dielectric constant is around 2. A dielectric constant of 2 can be achieved by increasing the amount and size of voids formed in the film. However, it lowers the film density too much and causes the film's resistance to the damascene processing technology to deteriorate significantly. Since conventional methods for forming low dielectric constant film increase the amount of voids in the film while also enlarging the void diameter to achieve the required dielectric constant levels, there is a trade-off relationship between these methods and film density.

As low dielectric constant films using silicon materials, SiBN containing boron (B), and BN, BCN and other films having boron in their basic composition, are evaluated. Although these films achieve a dielectric constant of 2 or even less, inclusion of boron in the composition presents concerns over insulation performance. In particular, these films tend to lose resistance over time. To avoid these problems, oxidization of B must be prevented. Since the film composition significantly affects the degree of oxidization of B, the correlation of film composition and reduction of dielectric constant must be investigated.

To control the dielectric constant in the formation of a low dielectric constant film, the diameter and amount of voids formed in the film are adjusted. As voids generate, the density of the film decreases while its mechanical strength also drops. Conventional silicon oxide films used in wiring processes had a density of approx. 1.9 $g/cm^3$ and a modulus of 50 GPa or more, which made them high quality films. On the other hand, the dielectric constants of low dielectric constant films adopted by 90-nm node devices are approx. 3.0 to 3.3, and their film density and modulus are approx. 1.4 to 1.6 $g/cm^3$ and approx. 20 to 30 GPa, respectively. Significant changes to the processing schemes using conventional silicon oxide films increased the time needed to start mass production, because improving the processing scheme to prevent damage caused by lower mechanical strength took longer than anticipated. However, such problems have since been resolved and prototypes and production devices of 65, 45 and 32-nm nodes are currently produced.

As for 65-nm node devices, in many cases films having dielectric constants equivalent to those of films used with 90-nm node devices are employed as insulation films between copper wiring layers. This is mainly due to the fact that an extra time is needed to evaluate the processing if low dielectric constant films having different dielectric constants are used for each generation of devices, and also to the discovery that the required dielectric constants can be amply achieved by lowering the dielectric constants using silicon carbide films used for prevention of copper diffusion. Actually dielectric constants have been dropping since 45-nm node devices, which are adopting films having a dielectric constant of approx. 2.5 to 2.8. Here, EB, UV and other types of curing technologies are used to prevent the film from being damaged due to the processing technology, to improve the density and mechanical strength of the film.

Starting from 32-nm node devices, the required levels of dielectric constant have suddenly dropped to a range of 2.0 to 2.2. The film characteristics of low dielectric constant films are notably different between the generations before and after. In particular, aging caused by leaving the formed film in the environment presents a critical problem. Pre-processing steps must be controlled to prevent this aging, which also gives rise to problems associated with complex handling. The first step implemented after a low dielectric constant film has been formed is to form via holes and trenches by means of dry etching. Thereafter, ashing is performed to remove residues, followed by chemical rinsing. A film damage occurs when the carbon contained in the low dielectric constant film dissociates due to the plasma used in dry etching and ashing and the film is permeated by the chemical solution used in the subsequent process. This permeation of chemical solution increases the dielectric constant of the low dielectric constant film by a significant margin of 0.2 to 0.5. When the film is let stand for 3 days thereafter, the dielectric constant will eventually exceed 10. As a result, the insulation characteristics will be affected and the insulation resistance will drop significantly.

Under the conventional methods, the porogen technique, whereby voids are removed from the formed film via curing, is generally used to reduce the low dielectric constant with ease. The increasing trend is that the control after void generation depends mainly on porogen material and curing. On the other hand, many problems remain unresolved regarding the controllability of film quality and stability associated with use of porogen material, because porogen residues in the film present problems.

SUMMARY OF THE INVENTION

To solve one or more of the aforementioned problems, an embodiment of the present invention provides a method for forming a low dielectric constant film by mixing a silicon-containing hydrocarbon gas and a silazane-containing gas to achieve a low dielectric film having high density and high strength. In an embodiment, the formed film has Si—O, Si—CH3, Si—H, C—H, Si—N and N—H bonds, and thus treating the film under heat and through UV curing in an atmosphere of oxidizing gas replaces Si—N and Si—H with Si—O and the final film only has Si—O, Si—CH3 and C—H bonds. By incorporating this technique proposed by the present invention, it becomes possible to form a Si—O skeleton based on Si—N and Si—H skeletons, and also control the amounts of Si—N and Si—H by controlling the feed rate of the silazane gas, thereby allowing the Si—O content to be controlled. The ratio of Si—O is important because it has a significant effect on the film density and mechanical strength. Also, it has been confirmed that the dielectric constant of the formed film can be as low as approx. 2.0, and the corresponding film density is in a range of 1.2 to 1.3 g/cm$^3$.

In an embodiment of the present invention, a method of forming a dielectric film, comprises: (i) introducing a siloxane gas essentially constituted by Si, O, C, and H and a silazane gas essentially constituted by Si, N, H, and optionally C into a reaction chamber where a substrate is placed; (ii) depositing a siloxane-based film including Si—N bonds on the substrate by plasma reaction; and (iii) annealing the siloxane-based film on the substrate in an annealing chamber to remove Si—N bonds from the film.

The above embodiment further includes, but is not limited to, the following embodiments:

In an embodiment, the method may further comprise increasing a flow rate ratio of the silazane gas to the siloxane gas in the gas-introducing step, thereby increasing mechanical strength of the annealed film obtained in the following annealing step. In an embodiment, a flow rate ratio of the silazane gas to the siloxane gas in the gas-introducing step may be controlled in the range of 0.1 to 5 (including 0.2, 0.5, 1, 2, 3, 4, and values between any two numbers of the foregoing). In an embodiment, the siloxane gas and the silazane gas may be introduced simultaneously. In an embodiment, no source gas other than the siloxane gas and the silazane gas may be used in the gas-introducing step. In an embodiment, the siloxane gas and the silazane gas may be mixed as a source gas upstream of the reaction chamber. In another embodiment, the siloxane gas and the silazane gas may be separately introduced into the reaction chamber.

In any of the foregoing embodiments, the deposition step may be controlled to deposit the siloxane-based film in a liquid state. In an embodiment, the deposition step may be conducted at a temperature of 100° C. or less.

In any of the foregoing embodiments, the annealing step may be comprised of heat treatment and UV treatment conducted consecutively. In an embodiment, the heat treatment may be conducted in an atmosphere containing nitrogen and oxygen (such as N2 and O2). In an embodiment, the UV treatment may be conducted at a temperature of 600° C. or less (e.g., 200° C. to 600° C.). In an embodiment, the UV treatment may be conducted by a Xe lamp.

In any of the foregoing embodiments, the gas-introducing step may further comprise introducing at least one gas selected from the group consisting of oxidizing gas, inert gas, and additive gas in the reaction chamber. In an embodiment, in the gas-introducing step, no oxygen-supplying gas may be introduced into the reaction chamber.

In any of the foregoing embodiments, the method may further comprise treating a surface of the substrate with a plasma using an oxidizing gas and/or an inert gas for improving affinity to the siloxane-based film prior to the gas-introducing step.

For purposes of summarizing the invention and the advantages achieved over the prior art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
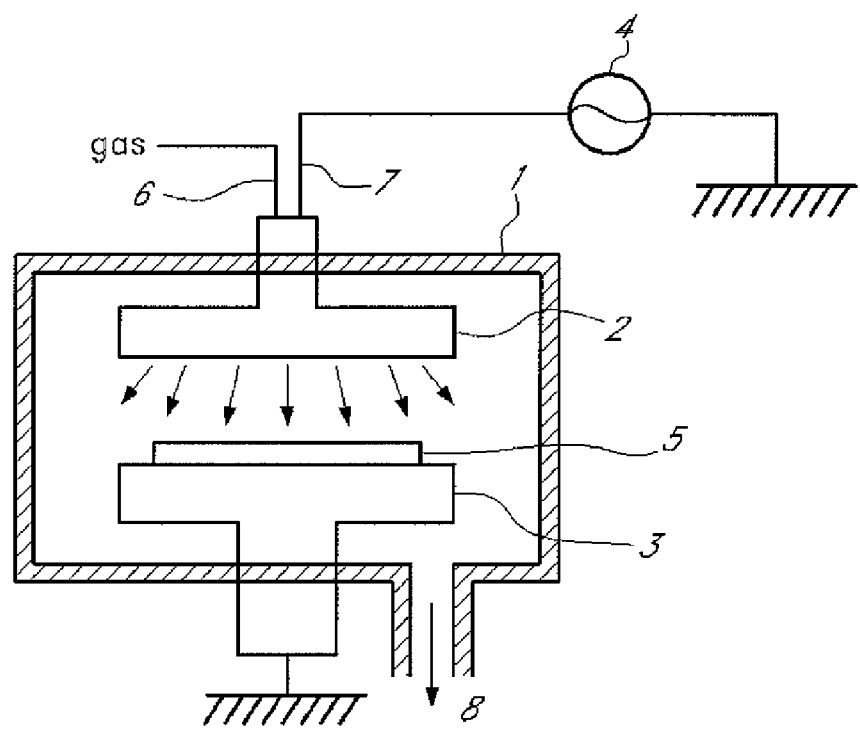
FIG. 1 is a schematic diagram showing a plasma CVD apparatus usable in an embodiment of the present invention.

In an embodiment of the present invention, the drop in film density and mechanical strength caused by a lower dielectric constant can be compensated for by selecting proper materials to be used in the film forming process. In particular, it is possible to form, using a silicone-containing hydrocarbon gas, a low dielectric constant skeleton essential in the achievement of a low dielectric constant, and to replace the Si—N and Si—H gases formed by silazane with Si—O in an atmosphere of oxidizing gas after the film has been formed. To be specific, for example, methyl trimethoxysilane and 1,1,3,3 tetramethyl disilazane can be used as materials, while He and O2 can be selected as an inert gas and an oxidizing gas, respectively. The susceptor temperature can be kept relatively low, or 0° C., for example, to keep the deposited reactant formed on the silicon-processing target liquid (the thickness may be set in a range of 300 to 1,000 nm, for example). After a film has been formed, the silicon processing target is maintained on a heated susceptor kept at 400° C., for example, through a vacuum transfer system, and heat treatment is performed in an atmosphere comprising the selected oxidizing gas O2 and N2, for example. At this time, Si—N and Si—H are partially replaced with Si—O, while impurities in the film, such as CH and NH, are discharged from the film. In an embodiment, the heat-treated wafer is exposed to an atmosphere and then UV-cured using a separate apparatus. The UV light source may be a Xe lamp having a wavelength of 172 nm, for example, and the film may be cured for 2 minutes, for example, in an atmosphere where O2 and N2 gases are mixed. During the UV curing process, Si—N and Si—H formed by silazane are also replaced with Si—O just like during the heat treatment process. If heat treatment is performed multiple times, the initial heat treatment is performed for the purpose of removing impurities and replacing Si—N, and if Si—N has not yet been replaced fully, UV curing is implemented further to complete the Si—O replacement and harden the film. (Although the final film thickness is determined according to the specific application, it is in a range of approx. 350 to 500 nm.)

In an embodiment, CH-containing impurities in the film are also removed, which makes it possible to lower the dielectric constant (to a range of 2.0 to 2.7, for example), while also forming a Si—O skeleton essential in the ensuring of sufficient density (such as 1.2 to 1.45 g/cm$^3$) and mechanical strength (such as EM of 10 to 18 GPa).

The present invention can be realized in various embodiments including, but not limited to, the following:

1) A method, using plasma CVD, for forming an insulation film of ultra-low dielectric constant having high mechanical strength, characterized in that a silicon-containing hydrocarbon material that forms the skeleton of the ultra-low dielectric constant film is mixed with a silazane material that forms a Si—O skeleton important in the ensuring of sufficient mechanical strength. The silicon-containing hydrocarbon gas is expressed by the general formula $Si_aO_bC_cH_x$ (in the formula, a, b, c and x are arbitrary integers). The silazane-containing gas is expressed by the general formula $Si_aN_bC_cH_x$ (in the formula, a, b and c are natural numbers, where c is a natural number including 0).

2) A method according to 1) above, characterized in that the susceptor is maintained at a temperature in a range of −50 to 300° C. inside the plasma CVD apparatus and when the susceptor temperature is 100° C. or below (including 90° C., 70° C., 50° C., 30° C., 10° C., and temperatures between any two of the foregoing), the reactant formed on the silicon processing target is deposited in a liquid state. The purpose of liquefying the reactants at a temperature of 100° C. or below is to suppress reactivity and maintain the molecular weight low in order to keep the skeleton close to the materials. The parameters used to add flowability at a temperature of 100° C. or below include lower pressure, lower RF power, and discharge gap. The discharge gap is increased or decreased according to the selected materials.

3) A method according to 1) or 2) above, characterized in that the surface condition is changed from hydrophobic to hydrophilic using a plasma pre-process (for example, a process implemented at a frequency of 2 MHz or more (e.g., 13.56 MHz), power of 50 to 400 W (e.g., 200 W), temperature of −10 to 50° C. (e.g., 0° C.), pressure of 100 to 800 Pa (e.g., 266.6 Pa), flow rate of inert gas (e.g., He gas) of 400 sccm to 3 SLM (e.g., 1 SLM), and time of 10 seconds to 5 minutes (e.g., 1 minute)) in order to control the surface tension, in consideration of the significant dependence of wettability improvement on the foundation on which a film is formed. The plasma pre-process may use an oxidizing agent (such as O2 or CO2 at 100 to 1,000 sccm) or inert gas (such as Ar or He at 500 to 2,000 sccm) or combination of both.

4) A method according to any one of 1) to 3) above, characterized in that annealing is performed to harden the formed film. As for the annealing method, heat treatment (implemented, for example, in an atmosphere where N2 and O2 are mixed) and curing (performed for 1 to 20 minutes, for example) with UV light (having a wavelength of 172 to 300 nm and power of 0.5 to 5 kW/cm$^2$, for example) can be used. Annealing is performed at a temperature in a range of 50 to 1,100° C. because the impurities need to be discharged from the film and the foundation film needs to be considered, and therefore such method is also characterized in that it combines heat treatment and UV curing and also comprises multiple treatment steps using heat. As a specific example of these multiple steps, first heat treatment is performed using a mixture of N2 and O2 at 200° C. to harden the film and promote Si—O replacement. The purpose here is to suppress dissociation of Si—CH3 by implementing the heat treatment at a low temperature using conditions resulting in weak oxidization power. At this time, CH-containing impurities are removed, while Si—N is also replaced with Si—O. Thereafter, UV curing is performed using a Xe lamp to remove the remaining N and also reinforce the density and skeleton at the same time.

5) A method according to any one of 1) to 4) above, wherein the silicon-containing hydrocarbon gas is introduced simultaneously. If the gases are introduced alternately, the film composition may become irregular in the depth direction or other unwanted effects may occur, in which case processing problems may also result. The method is characterized in that the silazane-containing gas is a mixture of SixHy and NxHy or SixNyCzHa (x, y and z are arbitrary natural numbers, where a is a natural number including 0). The ratio of silicon-containing hydrocarbon gas and silazane-containing gas is 0.1 to 5 in an embodiment where the flow rate of the silicon-containing hydrocarbon gas is 1, and the flow rate of the silicon-containing hydrocarbon gas is 15 to 500 sccm (including 50 sccm, 100 sccm, 300 sccm, and values between any two numbers of the foregoing), while the flow rate of the silazane-containing gas is 15 to 500 sccm (including 50 sccm, 100 sccm, 300 sccm, and values between any two numbers of the foregoing).

6) A method according to any one of 1) to 5) above, characterized in that the oxide film is formed using a mixture of the silicon-containing hydrocarbon material and selected oxidizing material, additive gas and inert gas.

7) A method according to 6) above, characterized in that, if an additive gas is used, it is selected from the group consisting of H2, $C_xH_yO_z$ (x is an integer of 1 to 10, y is a natural number, and z is 0, 1 or 2) and any combination thereof.

8) A method according to 6) or 7) above, characterized in that the flow rate of the additive gas is in a range of 5 to 900 sccm (e.g., 50 to 500 sccm).

9) A method according to any one of 6) to 8) above, characterized in that the inert gas is selected from the group consisting of He, Ar, Kr, Xe and any combination thereof.

10) A method according to any one of 6) to 9) above, characterized in that the flow rate of the inert gas is in a range of 10 to 10,000 sccm (e.g., 100 to 3,000 sccm).

11) A method according to any one of 1) to 10) above, characterized in that the RF power applied when a film is formed is selected from the group consisting of RF powers of 13.56 to 60 MHz.

12) A method according to any one of 6) to 11) above, characterized in that, if an oxidizing material is used, it is selected from the group consisting of O3, O2, CO2, N2O, H2O and any combination thereof.

13) A method according to any one of 6) to 12) above, characterized in that the flow rate of the oxidizing material is in a range of 10 to 3,000 sccm (e.g., 100 to 1,500 sccm).

14) A method according to 4) above, characterized in that the gas introduced during the heat treatment and UV curing after the film has been formed is an oxidizing gas of O2, O3, CO2, N2O, H2O, etc. (at a flow rate of 10 to 5,000 sccm or 100 to 2,000 sccm, for example), an inert gas of N2, He, Ar, etc. (at a flow rate of 1,000 to 50,000 sccm or 2,000 to 20,000 sccm, for example), or any combination thereof. The method is also characterized in that the temperature range of heat treatment is 100 to 1,000° C. (e.g., 200 to 600° C.). The method is also characterized in that heat treatment and UV curing are performed multiple times separately or in combination.

15) A method according to 14) above, characterized in that the temperature used in the heat treatment and UV curing aimed at replacing Si—N and Si—H with Si—O is 600° C. or below. The object here is to implement each process using an oxidizing gas (such as O2, CO2 or H2O, at a flow rate of 100 to 5,000 sccm or 300 to 2,000 sccm) in a temperature range lower than the above temperature to promote the oxidization of the foundation film.

16) A method according to any one of 1) to 15) above, characterized in that the silicon-containing gas is a siloxane material and constituted by at least one of methyl trimethoxysilane, dimethyl diethoxysilane, etc. For example, the materials described in U.S. Pat. Nos. 6,455,455, 6,818,570 and 6,740,602, and co-assigned U.S. patent application Ser. No. 11/465,751, now U.S. Pat. No. 7,354,873 (the disclosure of which is incorporated herein by reference in their entirety), and the like, can be used.

17) A method according to any one of 1) to 16) above, characterized in that the silazane material is expressed by Si—NxHy (where x and y are arbitrary integers; which can be formed using SiH$_4$ and NH$_3$) and/or SiaNbCcHd (where a, b, c and d are arbitrary integers) and constituted by at least one of tetramethyl disilazane, hexamethyl disilazane, etc.

Embodiments of the present invention are explained below in details using drawings. It should be noted, however, that the present invention is not at all limited to these examples.

FIG. 1 is a schematic diagram of a plasma CVD used in the present invention. This plasma CVD apparatus comprises a reaction chamber 1, upper electrode 2, lower electrode 3, gas introduction port 6, and high-frequency (RF) introduction part 7. The upper electrode and lower electrode are installed in parallel with and facing each other, and a susceptor 1 embedded in each of these electrodes is controlled by a water-cooler or heat exchanger. A semiconductor substrate, being a processing target, is placed on the lower electrode and maintained in a heated state. Numerous small holes are provided in the bottom face of the upper electrode, and gases are injected onto the semiconductor substrate 5 through these holes. The RF power is supplied from an external RF generator 4 and the gas introduction port 6 and RF introduction part 7 are electrically insulated.

In this example, a ultra-low dielectric constant film is formed on the semiconductor processing target using two process gases, or namely the silicon hydrocarbon gas and silazane-containing gas introduced into the reaction chamber, by means of the plasma generated via application of RF power. This film is merely an interim processed product before heat treatment and UV curing, and an embedded low dielectric constant film, which is a silicon-containing hydrocarbon compound having a dielectric constant of approx. 2.0 to 3.0, is formed after the subsequent curing or thermal annealing process performed in the UV curing apparatus shown in FIGS. 2 and 3.

The additive gas is constituted by an inert gas, oxidizing gas, reducing gas or any combination thereof. The inert gas is constituted by He, Ar, Kr, Xe or any combination thereof. Since each of these gases has a different ionization energy and collision cross-section area, the reaction in the vapor phase can be controlled by changing the combination of these gases.

The additive gas may be selected from the group consisting of hydrogen (H$_2$), CxH$_y$Oz (x is an integer of 1 to 10, y is a natural number, and z is 0, 1 or 2) and any combination thereof. If a hydrogen-containing additive gas is used in a large quantity, the thermal stability of the film tends to worsen, and thus the mixing ratio of process gases requires careful attention.

Once an insulation film has been formed on the semiconductor substrate, the gas in the reaction chamber is discharged from the exhaust port 8 while the semiconductor substrate is maintained in the reaction chamber, and the gas inside the reaction chamber is replaced with a reducing gas or a mixture of reducing gas and inert gas.

Figure 2:
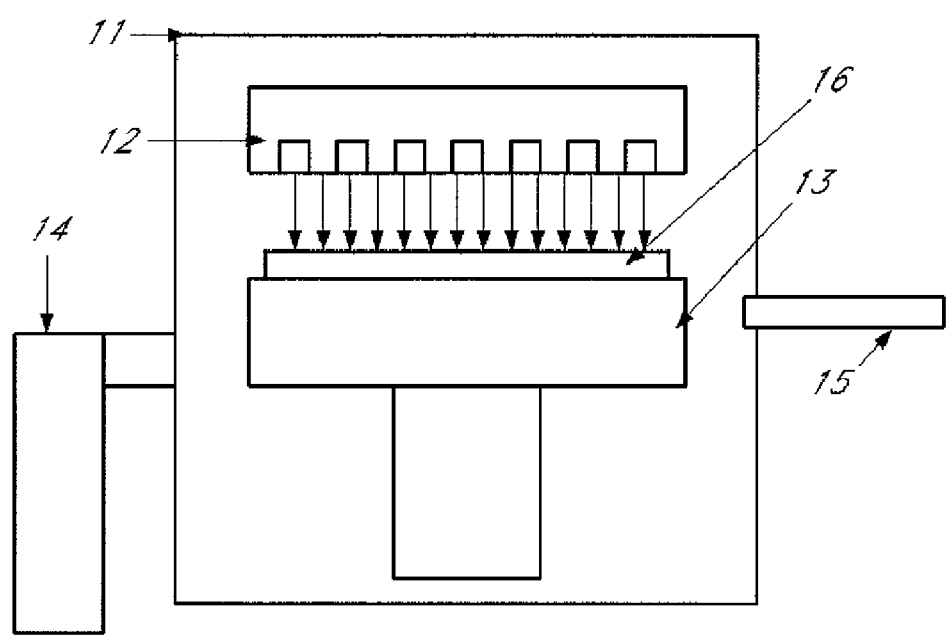
FIG. 2 is a schematic diagram showing a UV curing apparatus usable in an embodiment of the present invention.

Thereafter, the semiconductor substrate is released and cured in the UV curing apparatus shown in FIG. 2. The UV curing apparatus comprises a processing chamber 11, UV lamp 12, susceptors (cooling and heating) 13, exhaust port 14, and gas inlet 15. The lamp and susceptor heater are installed in parallel with each other and both are heated by an embedded heater. The semiconductor substrate, being the processing target, is placed on the susceptor and maintained in a heated state. Light is emitted from a UV lamp having a wavelength selected from a range of 172 to 250 nm, and irradiated onto the semiconductor substrate 16. As light is irradiated, He, H2, N2, CO2 or other gas is introduced.

As the UV cure apparatus, the apparatus disclosed in commonly assigned U.S. patent application Ser. No. 11/040,863 can be used, the disclosure of which is incorporated herein by reference in its entirety.

Figure 3:
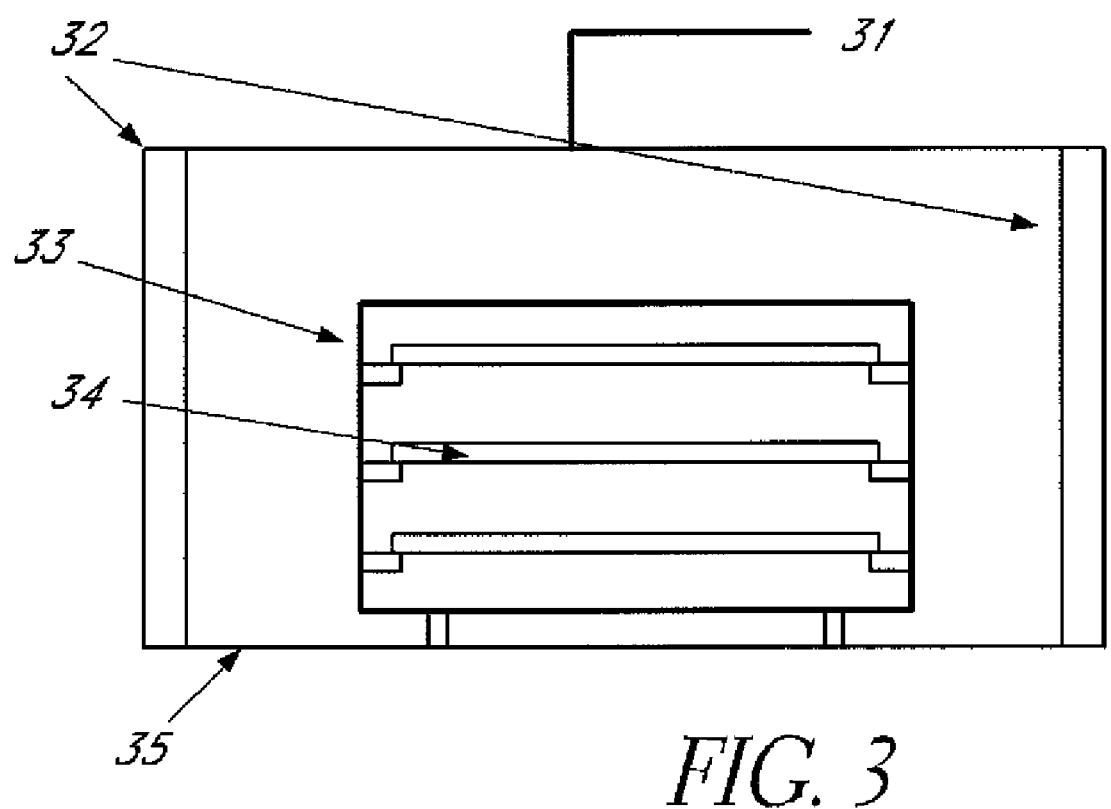
FIG. 3 is a schematic diagram showing a thermal annealing apparatus usable in an embodiment of the present invention.

If heat treatment is given to the formed film, the semiconductor substrate is treated using the heat treatment apparatus shown in FIG. 3.

FIG. 3 shows a schematic diagram of a thermal annealing apparatus. In a chamber 35, a quartz boat 33 is provided, and a substrate 34 is placed inside the quartz boat 33. The temperature inside the quartz boat 33 is controlled by a heater 32, and gases can be introduced inside through a gas inlet port 31.

In an embodiment of the present invention, a deposit produced by plasma reaction is formed on the silicon processing target maintained on the susceptor controlled at a temperature in a range of −50 to 300° C. If the susceptor temperature is 50° C. or below, the deposited reactant remains liquid. If the susceptor temperature is higher, however, the deposit forms a film. Accordingly, this characteristic can be used to apply the present invention in processes where embedding is required. Based on the above, the film characteristics can be controlled in consideration of the specific device process to which the present invention is applied.

In the present disclosure where conditions and/or structures are not specified, the skilled artisan in the art can readily provide such conditions and/or structures, in view of the present disclosure, as a matter of routine experimentation. Additionally, the conditions and/or structures disclosed in U.S. patent application Ser. No. 11/465,751 (now U.S. Pat. No. 7,354,873) and Ser. No. 11/759,159 (now U.S. Pat. No. 7,781,352) owned by the same assignee can be used in embodiments of the present invention. In the examples, the numerical numbers applied in embodiments can be modified by a range of at least ±50% in other embodiments, and the ranges applied in embodiments may include or exclude the endpoints.

EXAMPLE

Specific examples are explained below. Low dielectric constant films were formed using the apparatus shown in FIG. 1 under the conditions specified in Table 1.

TABLE 1

| | | | Film Forming Conditions | | | | | | |
|---|---|---|---|---|---|---|---|---|---|
| Example | Susceptor (° C.) | M-TMOS (sccm) | 1.1.3.3TMDS (sccm) | He (sccm) | 13.56 MHz (W) | Pressure (Pa) | Discharge gap (mm) | Heat treatment | Xe-UV treatment |
| 1 | 20 | 25 | 25 | 600 | 250 | 400 | 24 | 400° C. O2/N2 | 400° C. O2 |
| 2 | ↓ | 50 | 25 | ↓ | ↓ | ↓ | ↓ | ↓ | ↓ |
| 3 | ↓ | 25 | 50 | ↓ | ↓ | ↓ | ↓ | ↓ | ↓ |
| 4 | −5 | 50 | 25 | 400 | 300 | ↓ | 28 | ↓ | ↓ |
| 5 | ↓ | 100 | ↓ | ↓ | ↓ | ↓ | ↓ | ↓ | ↓ |
| 6 | ↓ | 200 | ↓ | ↓ | ↓ | ↓ | ↓ | ↓ | ↓ |

M-TMOS: Methyl trimethoxysilane
1,1,3,3 TMDS: 1,1,3,3 tetramethyl disilazane

TABLE 2

| | | | Evaluation Results of Film Quality Characteristics | | | | |
|---|---|---|---|---|---|---|---|
| Example | Dielectric constant | Dielectric breakdown (MV) | Leak current 2 MV(A/cm$^2$) | EM (GPa) | Film density (g/cm$^3$) | N groups in film (%) | Embedding characteristics |
| 1 | 2.6 | 5.5 | 1.0E−9 | 15 | 1.4 | Not detected | Favorable characteristics |
| 2 | 2.5 | 5.3 | 3.1E−9 | 14 | 1.36 | ↓ | ↓ |
| 3 | 2.7 | 5.7 | 2.1E−9 | 18 | 1.43 | ↓ | ↓ |
| 4 | 2.4 | 5.2 | 5.8E−9 | 13 | 1.34 | ↓ | ↓ |
| 5 | 2.2 | 5.2 | 5.2E−9 | 12 | 1.3 | ↓ | ↓ |
| 6 | 2.0 | 5.1 | 4.3E−9 | 10 | 1.25 | ↓ | ↓ |

Film density: Measured result using XRR/Remaining N groups in film: Measured by RBS-HFS The film forming time was set so as to achieve a liquid film thickness of 600 nm. During the heat treatment, the O2 flow rate and N2 flow rate were 500 sccm and 1 SLM, respectively, pressure was 800 Pa, and processing time was 60 minutes. During the Xe-UV treatment, the power was 5 mW/cm$^2$, O2 flow rate was 1 SLM, pressure was 45 Torr, and processing time was 2 minutes. The final film thickness was 500 nm.

Figure 4:
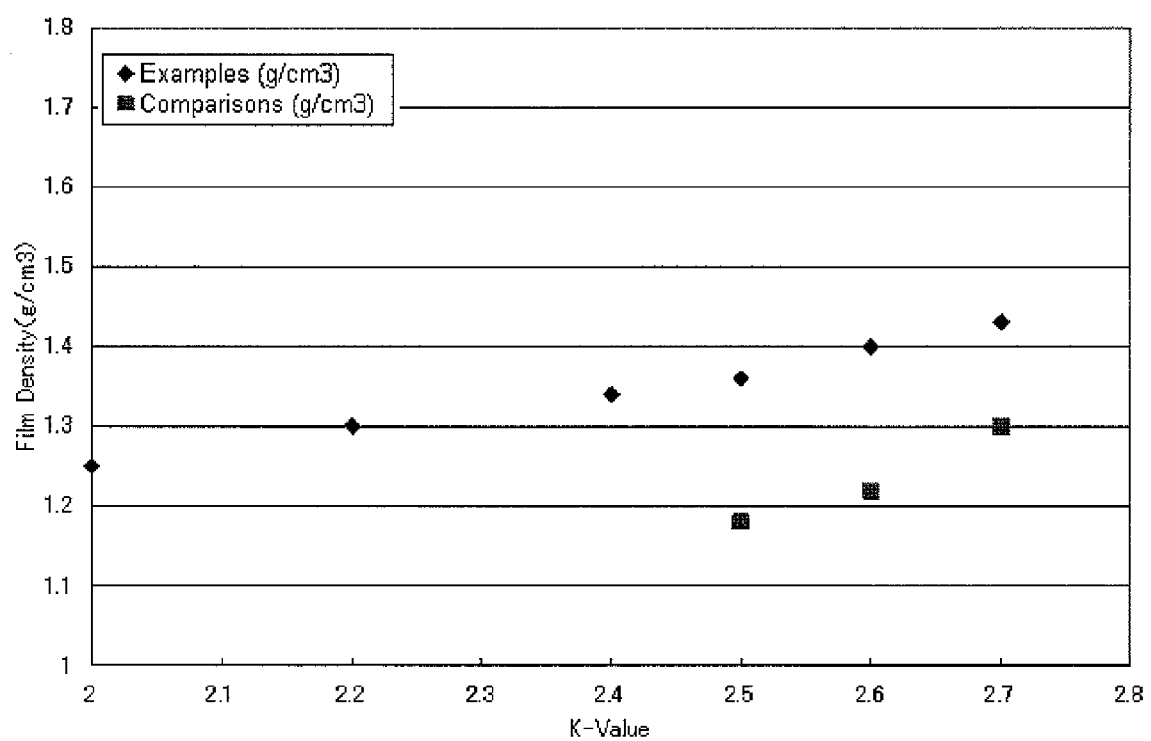
FIG. 4 is a graph showing the relationship between film density and dielectric constant (k) according to an embodiment of the present invention and a conventional method.

Table 2 shows the evaluation results of the characteristics of obtained films. Examples 5 and 6 show that the mechanical strength decreases when the amount of siloxane material increases. FIG. 4 shows the relationships of film density and specific dielectric constant in the above examples. As shown, the films which are formed by mixing siloxane and silazane materials exhibited notably higher film densities and excellent mechanical strengths at the same specific dielectric constants, compared to the films obtained by Comparative Examples where silazane material was not added (at corresponding specific dielectric constants, the film densities of films containing siloxane and silazane materials were higher by approx. 10% or more). At corresponding film densities, these films also had specific dielectric constants lower by 20% or more compared to the films obtained by Comparative Examples.

As explained above, an embodiment of the present invention is characterized in that a low dielectric constant skeleton is formed by a silicon-containing hydrocarbon gas, while a Si—O skeleton essential in the ensuring of sufficient mechanical strength is formed through a post-treatment in an oxidizing gas atmosphere of Si—N and Si—H formed by a silazane material. The method is also characterized in that while a film is being formed, the silicon-containing hydrocarbon gas is mixed with the silazane gas and used together with other gases selected from the group consisting of inert gases, oxidizing gases, CxHy, CxHyOz and other hydrocarbon gases, or any combination thereof. Another characteristic of such method is that, since the susceptor temperature is controlled at low levels while a film is being formed, the deposited reactant remains liquid and flowable. After the film has been formed, a process to replace Si—N and Si—H in the film with Si—O need to be performed simultaneously with a process to harden the film, and the temperature range that should be used is determined in consideration of the maximum allowable temperature of the foundation structure. Particularly with an insulation film for copper wiring that requires a low dielectric constant, the temperature needs to be kept to 400° C. or below and the heat treatment or UV curing, whichever is selected, is performed or both are combined. The film obtained through these processes no longer has nitrogen groups, and thus negative effects on improvement of resist quality, which is a problem in damascene processing, can be prevented. Also, application of low dielectric constant films as insulation films in other processes, such as PMD (pre-metal dielectric) processes, is being examined for future devices. The film satisfying the required characteristics for such application is an embedding film having high mechanical strength and a dielectric constant of 3.5 or less. These requirements can be met in embodiments of the present invention.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a dielectric film, comprising:
introducing a siloxane gas consisting essentially of Si, O, C, and H and a silazane gas consisting essentially of Si, N, H, and optionally C into a reaction chamber where a substrate is placed;
depositing a siloxane-based film including Si—N bonds on the substrate using both the siloxane gas and the silazane gas by plasma reaction; and
annealing the siloxane-based film on the substrate in an annealing chamber to remove Si—N bonds from the film.

2. The method according to claim 1, further comprising increasing a flow rate ratio of the silazane gas to the siloxane gas in the gas-introducing step, thereby increasing mechanical strength of the annealed film obtained in the following annealing step.

3. The method according to claim 1, wherein a flow rate ratio of the silazane gas to the siloxane gas in the gas-introducing step is controlled in the range of 0.1 to 5.

4. The method according to claim 1, wherein the annealing step is comprised of heat treatment and UV treatment conducted consecutively.

5. The method according to claim 4, wherein the heat treatment is conducted in an atmosphere containing nitrogen and oxygen.

6. The method according to claim 4, wherein the UV treatment is conducted by a Xe lamp.

7. The method according to claim 4, wherein the UV treatment is conducted at a temperature of 600° C. or less.

8. The method according to claim 4, wherein the UV treatment is conducted by UV light having a wavelength of 172 to 300 nm.

9. The method according to claim 1, wherein the gas-introducing step further comprises introducing at least one gas selected from the group consisting of oxidizing gas, inert gas, and additive gas in the reaction chamber.

10. The method according to claim 1, wherein the siloxane gas and the silazane gas are introduced simultaneously.

11. The method according to claim 1, further comprising treating a surface of the substrate with a plasma using an oxidizing gas and/or an inert gas for improving affinity to the siloxane-based film prior to the gas-introducing step.

12. The method according to claim 1, wherein in the gas-introducing step, no oxygen-supplying gas is introduced into the reaction chamber.

13. A method, comprising:
introducing a siloxane gas consisting essentially of Si, O, C, and H and a silazane gas consisting essentially of Si, N, H, and optionally C into a reaction chamber where a substrate is placed;
depositing a siloxane-based film including Si—N bonds on the substrate by plasma reaction; and
annealing the siloxane-based film on the substrate in an annealing chamber to remove Si—N bonds from the film,
wherein the deposition step is controlled to deposit the siloxane-based film in a liquid state.

14. The method according to claim 13, wherein the deposition step is conducted at a temperature of 100° C. or less.

* * * * *